US007102794B1

(12) United States Patent
Lübcke

(10) Patent No.: US 7,102,794 B1
(45) Date of Patent: Sep. 5, 2006

(54) METHOD FOR ENGRAVING PRINTING CYLINDERS

(75) Inventor: Bernd Lübcke, Molfsee (DE)

(73) Assignee: Hell Gravure Systems GmbH, Kiel (DE)

( * ) Notice: Subject to any disclaimer, the term of this patent is extended or adjusted under 35 U.S.C. 154(b) by 1009 days.

(21) Appl. No.: 10/110,645

(22) PCT Filed: Oct. 27, 2000

(86) PCT No.: PCT/DE00/03791

§ 371 (c)(1),
(2), (4) Date: Jul. 24, 2002

(87) PCT Pub. No.: WO01/32420

PCT Pub. Date: May 10, 2001

(30) Foreign Application Priority Data

Nov. 4, 1999 (DE) ................................ 199 52 995

(51) Int. Cl.
*B41C 1/04* (2006.01)
*G06F 19/00* (2006.01)
*G01D 21/00* (2006.01)
*G01R 23/02* (2006.01)

(52) U.S. Cl. ....................... 358/3.29; 700/175; 702/35; 73/659

(58) Field of Classification Search ...... 358/3.29–3.32, 358/504, 406; 702/34–35; 700/174–175, 700/177; 73/104, 658–660; 324/623; 382/152
See application file for complete search history.

(56) References Cited

U.S. PATENT DOCUMENTS 4,087,801 A * 5/1978 Noh ............................ 73/104
4,413,507 A * 11/1983 Drew et al. .................... 73/104
6,556,925 B1 * 4/2003 Mori et al. ................... 702/34

FOREIGN PATENT DOCUMENTS

| | | |
|---|---|---|
| DE | 23 36 089 | 2/1975 |
| DE | 23 45 858 | 5/1976 |
| DE | 25 08 734 | 8/1976 |
| DE | 197 22 996 | 12/1998 |
| DE | 198 01 472 | 7/1999 |
| WO | WO 95/08443 | 3/1995 |
| WO | WO 95/51438 | 10/1999 |

* cited by examiner

*Primary Examiner*—Scott A. Rogers
(74) *Attorney, Agent, or Firm*—Schiff Hardin LLP

(57) ABSTRACT

In a method and apparatus for engraving printing cylinders in an electronic engraving machine, an engraving control signal is formed from an image signal, which represents the tonal values of the cups to be engraved, and from a raster signal for generating a printing raster. An engraving stylus of an engraving element controlled by the engraving control signal engraves a printing form engraving line by engraving line in the form of cups arranged in the printing raster in a rotating printing cylinder. Functionability of the engraving stylus is continuously checked during engraving of the printing cylinder by a digital filtering of the engraving control signal in an engraving stylus monitoring device. When damage is found, a control signal is generated that aborts the engraving, or acoustically or optically signals the identified damage to the engraving stylus.

15 Claims, 2 Drawing Sheets

METHOD FOR ENGRAVING PRINTING CYLINDERS

BACKGROUND OF THE INVENTION

The invention is in the field of electronic reproduction technology and is directed to a method for engraving printing cylinders in an electronic engraving machine, to an engraving stylus monitoring device for an electronic engraving machine, and to an electronic engraving machine having such an engraving stylus monitoring device.

DE-C-2508734 already discloses an electronic engraving machine for engraving printing cylinders with an engraving element. The engraving element having an engraving stylus controlled by an engraving control signal as a cutting tool moves in an axial direction along a rotating printing cylinder. The engraving stylus cuts a sequence of cups arranged in a printing raster into the generated surface cylinder. The engraving control signal is formed by a superimposition of a periodic raster signal for generating the printing raster with image signal values that define the tonal values to be reproduced between "black" and "white". Whereas the raster signal effects an oscillating lifting motion of the engraving stylus for engraving the cups arranged in the printing raster, the image signal values determine the cut depths of the engraved cups corresponding to the tonal values to be reproduced.

DE-A-23 36 089 discloses an engraving element that essentially comprises a rotatory system and an electromagnetic drive for the rotatory system. The rotatory system comprises a shaft, an armature, a bearing for the shaft, a restoring element and a damping mechanism. A lever-shaped stylus holder is attached to the shaft, this carrying the engraving stylus. The electromagnetic drive for the rotatory system comprises an excitation coil charged with the engraving control signal and a stationary electromagnet in whose air gap the armature of the rotatory system moves. The drive effects a rotatory motion of the shaft oscillating by small angles, and the stylus holder together with the engraving stylus implements a corresponding, oscillating lifting motion in the direction of the generated surface of the printing cylinder for engraving the cups.

In practice, it occasionally occurs that the engraving stylus is damaged during the engraving of a printing cylinder, for example due to wear or due to mechanical overloading, or even break offs. In this case, the partially engraved printing cylinder is unuseable as a printing form and a new printing cylinder must be engraved. Damage to or breakage of the engraving stylus thus disadvantageously causes a loss of time in printing form manufacture that, in particular, can be substantial when engraving printing cylinders for packaging printing or decorative printing since the engraving of such printing cylinders can last several hours.

WO-A-9951438 already discloses an engraving machine for engraving printing cylinders wherein the actual dimensions of cups engraved on the printing cylinder are determined for recognizing damage to the engraving stylus, and error values are determined by comparing the actual dimensions to rated dimensions and wherein a signal for aborting the engraving is generated when the identified error values multiply exceed a prescribed limit value of tolerance range.

SUMMARY OF THE INVENTION

It is an object of the invention to specify a method and apparatus for engraving printing cylinders in an electronic engraving machine, an engraving stylus monitoring device for an electronic engraving machine, as well as an electronic engraving machine having such an engraving stylus monitoring device with which time loss in manufactured printing forms that arises in case of damage to an engraving stylus during engraving is advantageously reduced.

According to the invention, for engraving printing cylinders in an electronic engraving machine, an engraving control signal is formed from an image signal that represents tonal values of cups to be engraved and from a periodic raster signal for generating a printing raster. An engraving stylus of an engraving element controlled by the engraving control signal engraves a printing form engraving line by engraving line in the form of cups arranged in a printing raster in a rotating printing cylinder. The engraving control signal is continuously automatically investigated for harmonics characteristic of damage to the engraving stylus. Given presence of the characteristic harmonics, a control signal signaling damage to the engraving stylus is generated.

DESCRIPTION OF THE PREFERRED EMBODIMENTS

Figure 1:
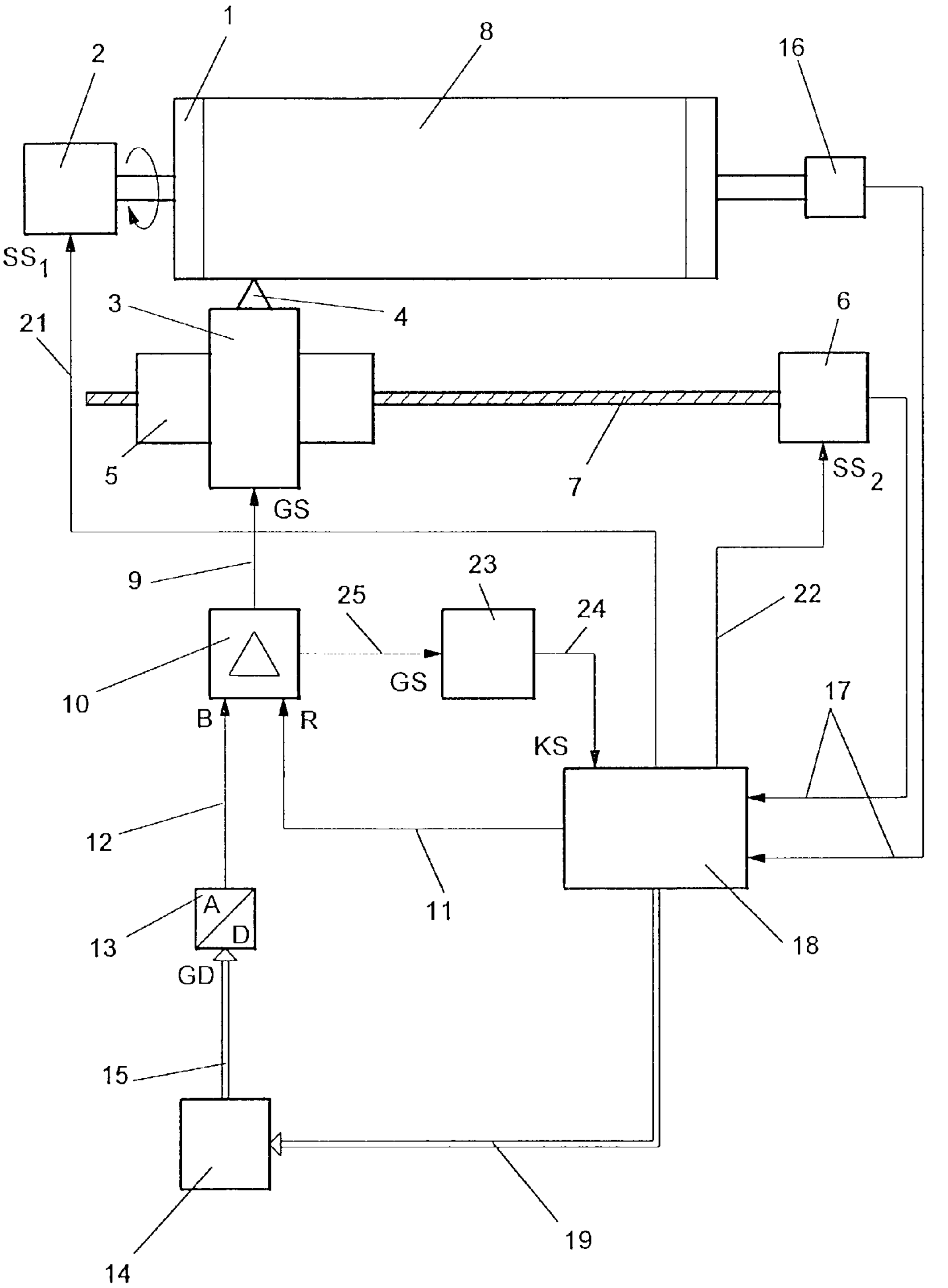
FIG. 1 is a block circuit diagram of an electronic engraving machine having an engraving stylus monitoring device.

For the purposes of promoting an understanding of the principles of the invention, reference will now be made to the preferred embodiment illustrated in the drawings and specific language will be used to describe the same. It will nevertheless be understood that no limitation of the scope of the invention is thereby intended, such alterations and further modifications in the illustrated device, and/or method, and such further applications of the principles of the invention as illustrated therein being contemplated as would normally occur now or in the future to one skilled in the art to which the invention relates.

FIG. 1 shows a block circuit diagram of an electronic engraving machine that, for example, is a Helioklischograph® of Hell Gravure Systems GmbH, Kiel, Germany.

A printing cylinder 1 is driven by a rotational drive 2. An engraving element 3 having an engraving stylus 4 as a cutting tool is mounted on an engraving carriage 5 that is movable in an axial direction of the rotating printing cylinder 1 with the assistance of a spindle 7 driven by a feed drive 6. The engraving element 3, for example, is equipped with an electromagnetic drive for the engraving stylus 4. The engraving stylus 4 can also be driven by a solid state actuator element comprising a piezoelectric or magnetorestrictive material.

The engraving element 3 engraves a printing form 8 in that the engraving stylus 4 controlled by an analog engraving control signal GS cuts a sequence of cups arranged in a printing raster into the generated surface of the printing cylinder 1 engraving line by engraving line while the engraving carriage 5 with the engraving element 3 moves along the rotating printing cylinder 1 in an axial direction step-by-step or continuously for planar engraving.

The engraving control signal GS on a line 9 is generated in an engraving amplifier 10 by superimposition of a periodic raster signal R on a line 11 with an image signal (B) on a line 12 that represents the tonal values between "light" and "dark" of the cups to be engraved. Whereas the raster signal R effects an oscillating lifting motion of the engraving stylus 4 for engraving the cups arranged in the printing raster, the image signal values B determine the cut depths of the cups corresponding to the tonal values to be reproduced. The image signal B is acquired in a D/A converter 13 from engraving data GD of the printing form 8 to be engraved. The engraving data GD are deposited in an engraving data memory 14 from which they are read out engraving line by engraving line and are supplied to the D/A converter 13 via a data bus 15.

The engraving locations of the cups on the printing cylinder 1 prescribed by the printing raster are defined by the location coordinates (x, y) of a coordinate system allocated to the generated surface of the printing cylinder 1 whose X-axis is aligned in the axial direction and whose Y-axis is aligned in the circumferential direction of the printing cylinder 1. The feed drive 6 generates the x-location coordinates and a pulse generator 16 mechanically coupled to the printing cylinder 1 generates the y-location coordinates. The xy-location coordinates are supplied via lines 17 to an engraving controller 18. The engraving controller 18 generates the raster signal R on a line 11, read addresses for the engraving data memory 14 on an address bus 19, as well as signals for the control and synchronization of the engraving sequence, for example a control signal SS, for the rotational drive 2 on a line 20 and a control signals $SS_2$ for the feed drive 6 on a line 21.

The engraving machine comprises an engraving stylus monitoring device 23 wherein the functionability of the engraving stylus 4 of the engraving element 3 is continuously automatically checked during engraving on the basis of the engraving control signal GS. In case of damage to the engraving stylus 4, particularly in case of stylus breakage, a control signal KS is generated. The checking of the functionability of the engraving stylus 4 according to the innovation occurs by an examination of harmonics in the engraving control signal GS that are characteristic of damage to the engraving stylus 4.

The engraving control signal GS is supplied to the engraving stylus monitoring device 23 from the engraving amplifier 10 via a line 25. The control signal KS that proceeds to the engraving controller 18 via a line 24 switches off the rotatory drive 2 and the feed drive 6 with the control signals $SS_1$ and $SS_2$ on the lines 20, 21 for the purpose of aborting the engraving in case of a stylus breakage. Simultaneously or alternatively, the stylus breakage can be acoustically or optically signaled with the assistance of the control signal KS.

There is the advantage that, due to the signaling of a stylus breakage, the engraving of a new printing cylinder 1 can be begun immediately for the purpose of saving time. As a result of the engraving abort given a stylus breakage, moreover, damage to the engraving element 3 or to the engraving machine itself is prevented, particularly given an automatic engraving execution.

Figure 2:
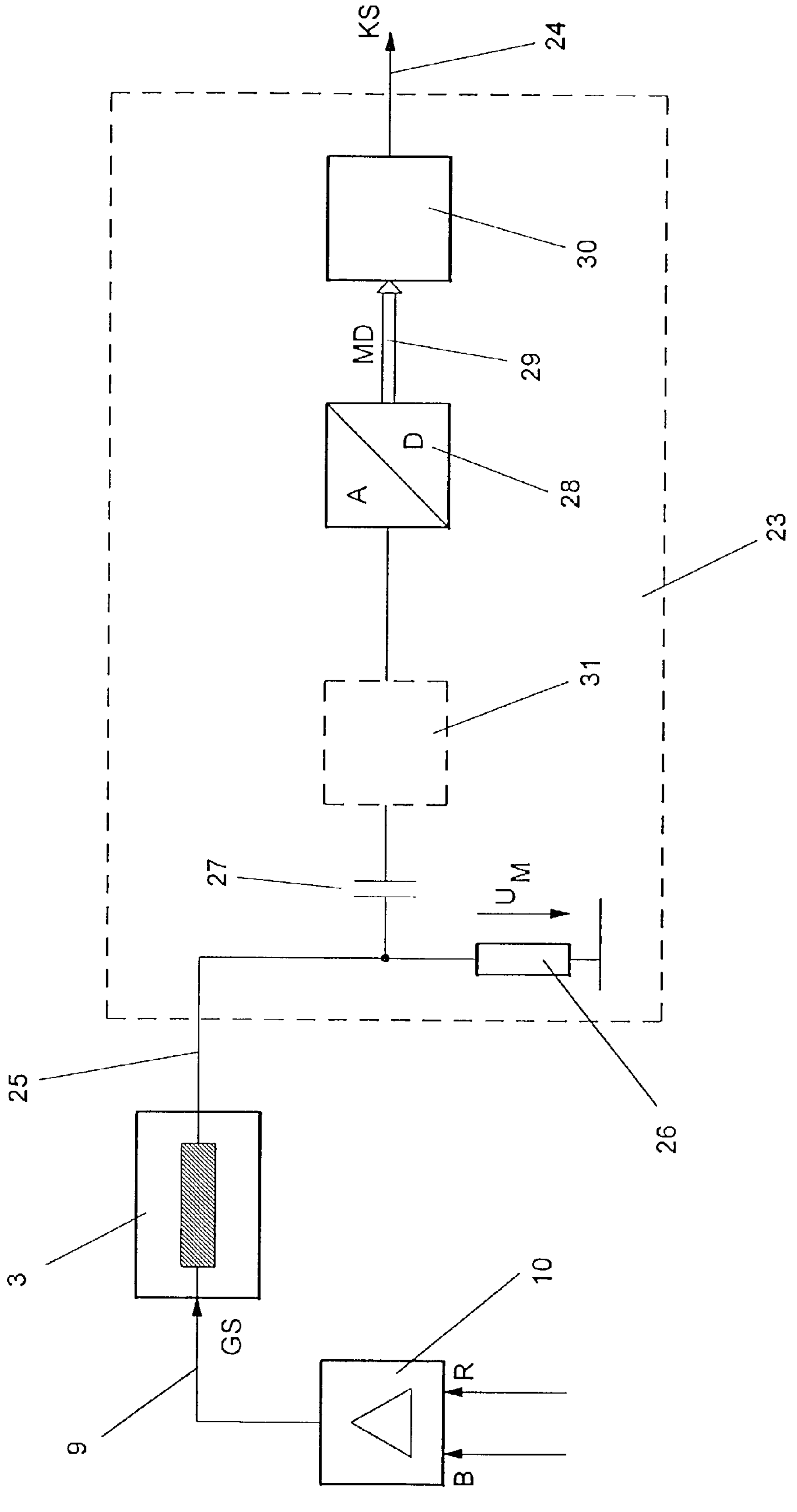
FIG. 2 is a schematic exemplary embodiment of an engraving stylus monitoring device.

FIG. 2 shows a schematic exemplary embodiment of the engraving stylus monitoring device 23. Given a current feed of the engraving element 3, the engraving control current $I_{GS}$ supplied via the line 25 is converted into a test voltage $U_M$ at a precision resistor 26, the test voltage $U_M$ proceeding via a capacitor 27 for separating the alternating voltage part out to an A/D converter 28 and is converted thereat into measured data MD. The measured data MD are supplied via a measured data bus 29 to a signal processor 30 that can be preferably designed as a digital signal processor (DSP), for example of the type TMS 320C31 of Texas Instruments.

In the signal processor, the measured data MD are continuously investigated for superimposed harmonics and, for example with a fast Fourier transformation (FFT), the frequency spectrum of the harmonics is identified. The identified frequency spectra are compared to a previously produced and stored frequency spectrum that is characteristic of an undamaged engraving stylus 4. Given non-coincidence of the frequency spectra, there is damage to the engraving stylus 4, and the control signal KS on the line 24 is generated. Alternatively, the identified frequency spectra can also be compared to a frequency spectrum characteristic of a damaged engraving stylus 4, whereby the correction signal KS is generated in this case given coincidence of the frequency spectra.

Such Fourier transformations known and, for example, are described in Rabbiner, L. R., "Theory And Application Of Digital Signal Processing", Chapter 6, 1975, ISBN 0-13-914101-4.

For improving the harmonics analysis, the relationship of payload signal to noise signal is advantageously reduced in that the harmonics to be analyzed are filtered out of the test voltage $U_M$ with a suitable filter whereby the filtering occurs dependent on the frequency of the raster signal R.

While a preferred embodiment has been illustrated and described in detail in the drawings and foregoing description, the same is to be considered as illustrative and not restrictive in character, it being understood that only the preferred embodiment has been shown and described and that all changes and modifications that come within the spirit of the invention both now or in the future are desired to be protected.

The invention claimed is:

1. A method for engraving printing cylinders in an electronic engraving machine, comprising the steps of:

forming an engraving control signal from an image signal that represents tonal values of cups to be engraved and from a periodic raster signal for generating a printing raster;

engraving with an engraving stylus of an engraving element controlled by the engraving control signal a printing form engraving line by engraving line in the form of the cups arranged in the printing raster in a rotating printing cylinder;

continuously automatically investigating the engraving control signal for harmonics characteristic of damage to the engraving stylus; and given presence of the characteristic harmonics, generating a control signal signaling damage to the engraving stylus.

2. The method according to claim 1 wherein the damage to the engraving stylus comprises breakage.

3. The method according to claim 1 wherein the investigation of the harmonics of the engraving control signal occurs by a digital filtering.

4. The method according to claim 3 wherein the digital filtering comprises a fast Fourier transformation.

5. The method according to claim 3 wherein the frequency spectrum of the harmonics in the engraving control signal determined by the digital filtering is compared to a frequency spectrum characteristic of an undamaged engraving stylus, and the control signal is generated given deviation of the frequency spectrum.

6. The method according to claim 1 wherein the harmonics to be investigated are filtered out of the engraving control signal for reducing a ratio of useful signal to noise signal.

7. The method according to claim 3 wherein the filtering occurs dependent on a frequency of the raster signal.

8. The method according to claim 1 wherein the identified damage to the engraving stylus is at least one of acoustically and optically signaled with the control signal.

9. The method according to claim 1 wherein the engraving of the printing cylinder is aborted by the control signal when damage to the engraving stylus has been found.

10. A method for engraving printing cylinders in an electronic engraving machine, comprising the steps of:

forming an engraving control signal from an image signal that represents tonal values of cups to be engraved and from a periodic raster signal for generating a printing raster;

engraving with an engraving stylus of an engraving element controlled by the engraving control signal a printing form engraving line by engraving line in the form of the cups arranged in the printing raster in a rotating printing cylinder;

investigating the engraving control signal for harmonics characteristic of damage to the engraving stylus; and given presence of the characteristic harmonics, generating a control signal signaling damage to the engraving stylus.

11. An engraving stylus monitoring system for an electronic engraving machine for engraving printing cylinders with an engraving stylus controlled by an engraving control signal, comprising:

an engraving stylus monitoring device charged with the engraving control signal and which investigates the engraving control signal for harmonics characteristic of damage to the engraving stylus by a digital filtering, compares the frequency spectrum of the harmonics identified by means of the digital filtering to a frequency spectrum characteristic of an undamaged engraving stylus; and generates a control signal signaling identified damage to the engraving stylus given deviation of the frequency spectrum.

12. The system of claim 11 wherein the digital filtering comprises a fast Fourier transformation.

13. The system according to claim 11 wherein the damage comprises breakage of the engraving stylus.

14. An engraving stylus monitoring system for an electronic engraving machine for engraving printing cylinders with an engraving stylus controlled by an engraving control signal, comprising:

an engraving stylus monitoring device charged with the engraving control signal and which investigates the engraving control signal for harmonics characteristic of damage to the engraving stylus, compares the frequency spectrum of the harmonics identified to a frequency spectrum characteristic of an undamaged engraving stylus; and generates a control signal signaling identified damage to the engraving stylus given deviation of the frequency spectrum.

15. An engraving machine for engraving printing cylinders, comprising:

a rotatably seated printing cylinder and an engraving element having an engraving stylus controlled by an engraving control signal that engraves a sequence of cups arranged in an engraving raster into the rotating printing cylinder engraving line by engraving line, the engraving element being axially displaceable along the rotating printing cylinder for planar engraving;

an engraving stylus monitoring device charged with the engraving control signal, wherein the monitoring device investigates the engraving control signal for harmonics characteristic of damage to the engraving stylus by a digital filtering by investigating the engraving control signal for harmonics characteristic of damage to the engraving stylus by a digital filtering, compares the frequency spectrum of the harmonics identified by the digital filtering to a frequency spectrum characteristic of an undamaged engraving stylus, and generates a control signal signaling the identified damage to the engraving stylus given deviation of the frequency spectra.

* * * * *